United States Patent
Wang et al.

(10) Patent No.: US 11,418,221 B2
(45) Date of Patent: Aug. 16, 2022

(54) METHOD AND POLAR CODE DECODER FOR DETERMINING TO-BE-FLIPPED BIT POSITION

(71) Applicant: National Tsing Hua University, Hsinchu (TW)

(72) Inventors: Chung-Hsuan Wang, Hsinchu (TW); Yi-Han Pan, Hsinchu (TW); Yu-Heng Lin, Hsinchu (TW); Yeong-Luh Ueng, Hsinchu (TW); Chin-Liang Wang, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 20 days.

(21) Appl. No.: 17/156,647

(22) Filed: Jan. 25, 2021

(65) Prior Publication Data

US 2022/0149868 A1 May 12, 2022

(30) Foreign Application Priority Data

Nov. 10, 2020 (TW) ................................. 109139184

(51) Int. Cl.
*H03M 13/00* (2006.01)
*H03M 13/39* (2006.01)
(Continued)

(52) U.S. Cl.
CPC ... *H03M 13/6572* (2013.01); *H03M 13/1575* (2013.01); *H03M 13/3933* (2013.01); *H03M 13/45* (2013.01); *H03M 13/451* (2013.01)

(58) Field of Classification Search
CPC ......... H03M 13/6572; H03M 13/3933; H03M 13/451
See application file for complete search history.

(56) References Cited

U.S. PATENT DOCUMENTS 10,833,706 B2 * 11/2020 Kim .................. H03M 13/2906
2017/0214416 A1 * 7/2017 Ge ......................... H03M 13/13
(Continued)

FOREIGN PATENT DOCUMENTS

CN 106301387 1/2017
TW 201931781 A 8/2019

OTHER PUBLICATIONS

Yu Yongrun, et al., "Successive Cancellation List Bit-flip Decoder for Polar Codes", 10th International Conference on Wireless Communications and Signal Processing (WCSP), Oct. 18-20, 2018, pp. 1-6.

(Continued)

*Primary Examiner* — Joseph D Torres
(74) *Attorney, Agent, or Firm* — JCIPRNET

(57) ABSTRACT

The disclosure provides a method and a polar code decoder for determining a to-be-flipped bit position when performing a successive cancellation list flip operation. The method includes: obtaining a polar code decoding tree generated by performing a successive cancellation list (SCL) operation on a polar code segment, and the polar code segment includes multiple bit positions, and each bit position in the polar code decoding tree includes multiple surviving paths and multiple pruned paths; in a post-processing stage for the SCL operation, estimating a correct path probability of each of the surviving paths and the pruned paths of the i-th bit position and accordingly estimating a reliability for the i-th bit position; selecting a specific bit position among the bit positions based on the reliability of each bit position; and performing an SCL flip operation on the polar code decoding tree based on the specific bit position.

10 Claims, 3 Drawing Sheets

(51) Int. Cl.
  *H03M 13/45* (2006.01)
  *H03M 13/15* (2006.01)

(56) References Cited

U.S. PATENT DOCUMENTS

2017/0366199 A1   12/2017  Ge et al.
2020/0403635 A1*  12/2020  Huang ................. H03M 13/09

OTHER PUBLICATIONS

Fengyi Cheng, et al., "Bit-Flip Algorithm for Successive Cancellation List Decoder of Polar Codes", IEEE Access (vol. 7), May 3, 2019, pp. 58346-58352.
Alexios Balatsoukas-Stimming, et al., "LLR-Based Successive Cancellation List Decoding of Polar Codes", IEEE Transactions on Signal Processing, vol. 63, No. 19, Oct. 1, 2015, pp. 5165-5179.
Chung-Hsuan Wang, et al., "Post-Processing for CRC-Aided Successive Cancellation List Decoding of Polar Codes", IEEE Communications Letters, vol. 24, No. 7, Jul. 2020, pp. 1395-1399.
Yi-Han Pan, et al., "Generalized SCL-Flip Decoding of Polar Codes", IEEE Global Commun. Conf. (GLOBECOM), Dec. 2020, pp. 1-6.

* cited by examiner

METHOD AND POLAR CODE DECODER FOR DETERMINING TO-BE-FLIPPED BIT POSITION

CROSS-REFERENCE TO RELATED APPLICATION

This application claims the priority benefit of Taiwan application serial no. 109139184, filed on Nov. 10, 2020. The entirety of the above-mentioned patent application is hereby incorporated by reference herein and made a part of this specification.

BACKGROUND

Technical Field

The disclosure relates to a polar code decoder mechanism, and more particularly to a method and a polar code decoder for determining the to-be-flipped bit position when performing a successive cancellation list (SCL) flip operation.

Description of Related Art

Research shows that polar code is the first encoding method that can theoretically reach Shannon Capacity, and it has also been selected as the encoding method for the control channel in the fifth-generation mobile communication technology.

When decoding the polar code, the main decoding methods generally include successive cancellation list (SCL) and belief propagation.

Generally speaking, when SCL is applied to decode a polar code segment including multiple bit positions to construct a decoding tree, each bit position will preserve L (for example, 4) surviving paths, and the rest of the paths will be pruned, as shown in FIG. 1. After the decoding of each bit position is completed, cyclic redundancy check (CRC) needs to be individually performed on the currently preserved L surviving paths. However, if none of the L surviving paths passes the CRC, it is necessary to declare a decoding failure. In addition, if a post-processing decoder is applied, after collecting the data in the previous decoding process, another post-processing operation is required to try to find the correct decoding path again.

In the conventional technology, common post-processing operations include an SCL flip operation. The spirit of the SCL flip operation is to firstly select a to-be-flipped bit position among the above-mentioned bit positions based on a certain selection principle, and then to flip the path in the to-be-flipped bit position to a certain degree (for example, pruning the original surviving paths, and changing the original pruned paths into the surviving paths, etc.) to perform SCL again.

Therefore, for persons skilled in the art, how to design a mechanism for selecting a better to-be-flipped bit position is an important issue.

SUMMARY

In view of this issue, the disclosure provides a method and a polar code decoder to determine the to-be-flipped bit position when performing the SCL flip operation, which can be applied to solve the above technical problem.

The disclosure provides a method for determining a to-be-flipped bit position when performing an SCL flip operation, including: obtaining a polar code decoding tree, and the polar code decoding tree is generated by performing an SCL operation on a polar code segment, and the polar code segment includes multiple bit positions, and each of the bit positions includes multiple surviving paths and multiple pruned paths in the polar code decoding tree; in a post-processing stage of the SCL operation, for an i-th bit position among the bit positions, estimating a correct path probability of each of the surviving paths and the pruned paths of the i-th bit position and accordingly estimating a reliability for the i-th bit position; selecting a first specific bit position from the bit positions as a to-be-flipped bit position based on the reliability of each of the bit positions; and performing an SCL flip operation on the polar code decoding tree based on the first specific bit position.

The disclosure provides a polar code decoder, including a storage circuit and a processor. The storage circuit stores multiple modules. The processor is coupled to the storage circuit and accesses the modules to perform the following steps: obtaining a polar code decoding tree, and the polar code decoding tree is generated by performing an SCL operation on a polar code segment, and the polar code segment includes multiple bit positions, and each of the bit positions includes multiple surviving paths and multiple pruned paths in the polar code decoding tree; in a post-processing stage of the SCL operation, for an i-th bit position among the bit positions, estimating a correct path probability of each of the surviving paths and the pruned paths of the i-th bit position and accordingly estimating a reliability for the i-th bit position; selecting a first specific bit position from the bit positions as a to-be-flipped bit position based on the reliability of each of the bit positions; and performing an SCL flip operation on the polar code decoding tree based on the first specific bit position.

DETAILED DESCRIPTION OF DISCLOSED EMBODIMENTS

Figure 1:
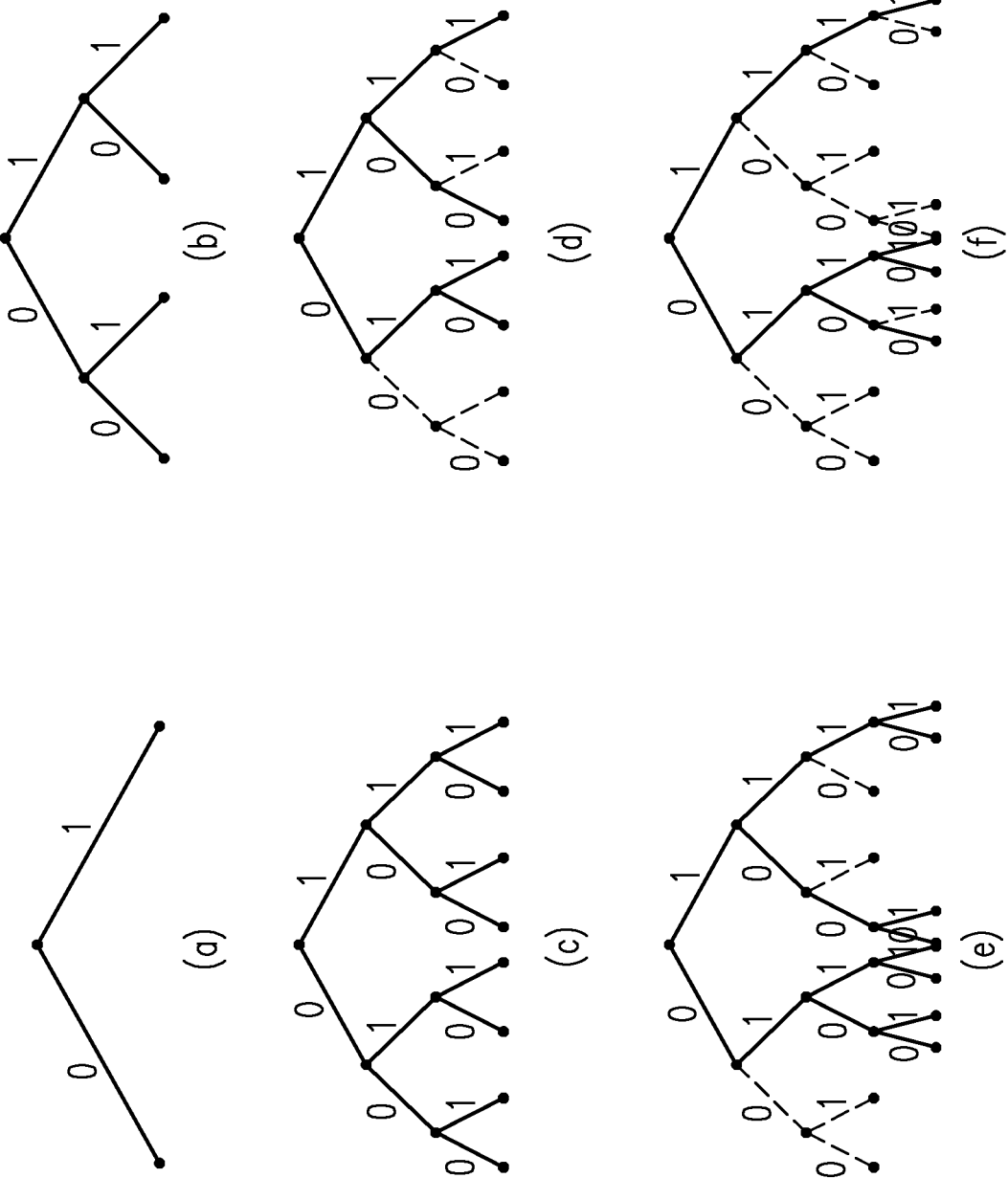
FIG. 1 is a schematic diagram of the conventional SCL.
Figure 2:
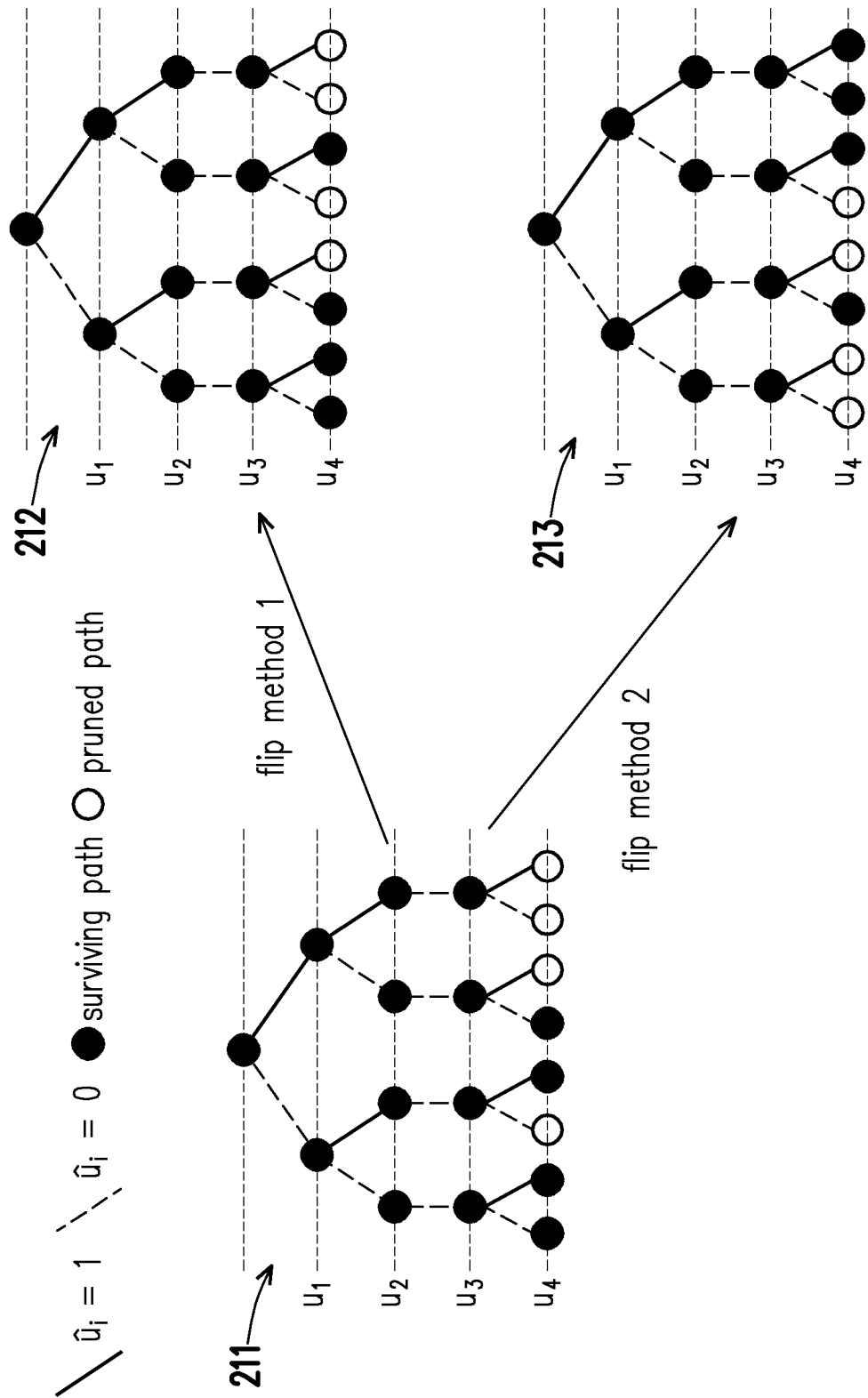
FIG. 2 is a schematic diagram of performing an SCL flip operation according to an embodiment of the disclosure.

Please refer to FIG. 2, which is a schematic diagram of performing an SCL flip operation according to an embodiment of the disclosure. In FIG. 2, it is assumed that the considered polar code segment can be characterized as (4, 3) (that is, the length is 4 bits, and 3 of the bits are information bits), and the adopted L value is 4, and a polar code decoding tree 211 as shown in FIG. 2 can be obtained after the polar code segment undergoes SCL.

Specifically, in the SCL process, in addition to the bit position corresponding to the frozen bit, each node at each bit position splits into two paths, and when the total number of paths in a bit position exceeds L, this bit position will preserve L surviving paths with a lower path metric (PM), and prune other paths.

It can be seen from the polar code decoding tree 211 that it includes 4 bit positions $u_1$-$u_4$ in total. Since the bit position $u_3$ does not split into 2 paths like other bit positions, it can be known that the bit position $u_3$ is a frozen bit.

In FIG. 2, it can be seen that the 4 (that is, L) surviving paths of the polar code decoding tree 211 at the bit position $u_4$ are respectively 0000, 0001, 0101, and 1000 (the solid line is 1, and the dashed line is 0). Assuming that none of the above-mentioned 4 surviving paths passes the CRC, in the post-processing stage, a position in the information bits can be selected for flipping. However, the first log 2L information bits cannot be selected because no paths are pruned at these positions. Assuming that the bit position $u_4$ is selected as the to-be-flipped bit position, the 4 surviving paths and 4 pruned paths included in the bit position $u_4$ may be flipped based on the selected flip method.

For example, assuming that the selected flip method is the method (hereinafter referred to as flip method 1) proposed by Y. Yu, Z. Pan, N. Liu, and X. You, "Successive cancellation list bit-flip decoder for polar codes," in *Proc. 10th Int. Conf. Wireless Commun. Signal Process.* (WCSP) pp. 1-6, October 2018 (hereinafter referred to as Document 1), the polar code decoding tree 211 may be adjusted to the state of a decoding tree 212.

In the bit position $u_4$ of the decoding tree 212, some surviving paths may be flipped into pruned paths, and some pruned paths may be flipped into surviving paths. For related details, please refer to the description in Document 1, which will not be repeatedly described herein. After that, the decoding tree 212 may be applied to perform another SCL to try to find the correct decoding path.

For another example, assuming that the selected flip method (hereinafter referred to as flip method 2) is the method proposed by C. Fengyi, L. Aijun, Z. Yingxian, and R. Jing, "Bit-flip algorithm for successive cancellation list decoder for polar codes," in *IEEE Access* pp. 1-7, May 2019 (hereinafter referred to as Document 2), the polar code decoding tree 211 may be adjusted to the state of the decoding tree 213.

In the bit position $u_4$ of the decoding tree 213, the original surviving paths may all be flipped into pruned paths, and the original pruned paths may all be flipped into surviving paths. For related details, please refer to the description in Document 2, which will not be repeatedly described herein. After that, the decoding tree 213 may be applied to perform another SCL to try to find the correct decoding path.

As mentioned earlier, to find the correct decoding path, it is very important to select the to-be-flipped bit position. Therefore, the disclosure proposes a method and a polar code decoder for determining the to-be-flipped bit position when performing the SCL flip operation, which can be applied to better find the suitable to-be-flipped bit position, thereby improving the decoding efficiency.

Figure 3:
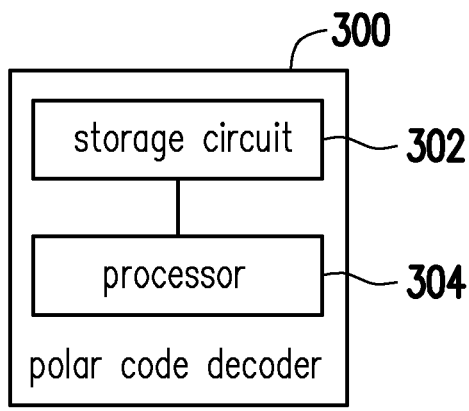
FIG. 3 is a schematic diagram of a polar code decoder according to an embodiment of the disclosure.

Please refer to FIG. 3, which is a schematic diagram of a polar code decoder according to an embodiment of the disclosure. As shown in FIG. 3, a polar code decoder 300 includes a storage circuit 302 and a processor 304. The storage circuit 302 is, for example, any type of random access memory (RAM), read-only memory (ROM), flash memory, a hard disk or other similar devices or a combination of these devices, and may be configured to record multiple codes or modules.

The processor 304 is coupled to the storage circuit 302, and may be a general purpose processor, a special purpose processor, a conventional processor, a digital signal processor, multiple microprocessors, one or more microprocessors combined with a digital signal processor core, a controller, a microcontroller, an application specific integrated circuit (ASIC), a field programmable gate array (FPGA), any other type of integrated circuit, a state machine, a processor based on advanced RISC machine (ARM) and similar products.

In the embodiment of the disclosure, the processor 304 may access the modules and program codes recorded in the storage circuit 302 to implement the method of determining the to-be-flipped bit position when performing the SCL flip operation. The details are described below.

Figure 4:
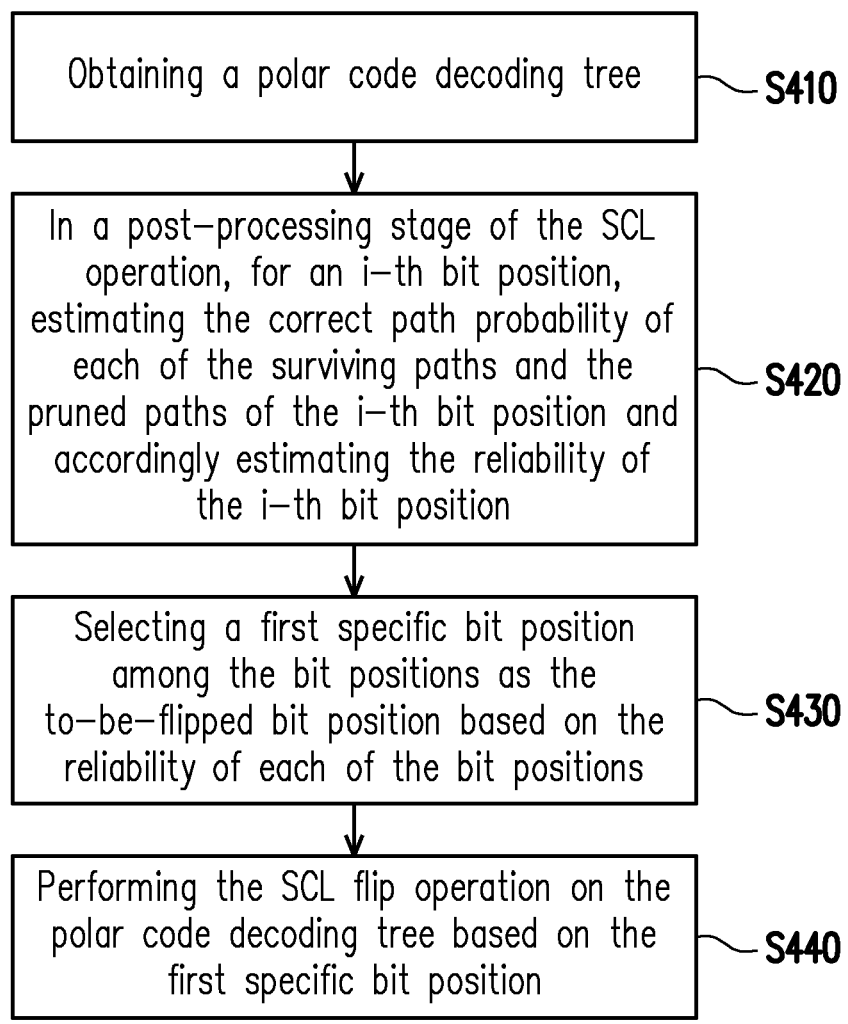
FIG. 4 is a flowchart of a method for determining a to-be-flipped bit position when performing the SCL flip operation according to an embodiment of the disclosure.

Please refer to FIG. 4. FIG. 4 is a flowchart of a method for determining a to-be-flipped bit position when performing the SCL flip operation according to an embodiment of the disclosure. The method of this embodiment may be executed by the polar code decoder 300 in FIG. 3. The details of each step in FIG. 4 are described below in conjunction with the components shown in FIG. 3.

First, in step S410, the processor 304 may obtain a polar code decoding tree, and the polar code decoding tree (for example, the polar code decoding tree 211 in FIG. 2) is generated by performing an SCL operation on a polar code segment. The polar code segment may include multiple bit positions, and each bit position includes multiple surviving paths and multiple pruned paths in the polar code decoding tree. In different embodiments, the above-mentioned polar code segment may be, for example, a signal received by the polar code decoder 300 or a codeword to be transmitted, but it is not limited thereto.

Thereafter, in step S420, in the post-processing stage of the SCL operation (that is, none of the L surviving paths of the above-mentioned polar code decoding tree passes the CRC), for an i-th bit position (where i is a positive integer, $1 \leq i \leq N$, and N is the length of the polar code segment), the processor 304 may estimate the correct path probability of each of the surviving paths and the pruned paths of the i-th bit position, and accordingly estimate the reliability of the i-th bit position. In an embodiment, the correct path of a path is, for example, the probability that the path is a correct (decoded) path, but it is not limited thereto.

In an embodiment, the processor 304 may obtain the path metric of each of the surviving paths and the pruned paths of the i-th bit position to accordingly sort the surviving paths and the pruned paths of the i-th bit position in an ascending order to generate a path set corresponding to the i-th bit position. Since the path metric of each of the surviving paths and the pruned paths of the i-th bit position has been calculated in the previous process of SCL, no additional calculation is required here. In addition, since the L surviving paths of the i-th bit position are originally L paths with a smaller PM, the path set of the i-th bit position may be understood as the path set including multiple paths, and these paths are sequentially corresponding to the above-mentioned surviving paths and the above-mentioned pruned paths. In short, in the path set, the first L paths are all surviving paths, and the last L paths are all pruned paths.

Then, for a k-th path in the path set of the i-th bit position, the processor 304 may calculate $e^{-PM_k^{(i)}}$ as the correct path probability of the k-th path, and $PM_k^{(i)}$ is the path metric of the k-th path. For details of calculating the correct path probability of the k-th path described here, please refer to the content of A. Balatsoukas-Stimming, M B Parizi, and A. Burg, "LLR-based successive cancellation list decoding of polar codes," in *IEEE Trans. Signal Process.*, vol. 63, no. 19, pp. 5165-5179, October 2015, and they will not be repeated herein.

In an embodiment, the processor 304 may be configured to perform: estimating a first reference value based on the correct path probability of each of the surviving paths at the i-th bit position; estimating a second reference value based on the correct path probability of each of the pruned paths at the i-th bit position; and estimating the reliability of the i-th bit position based on the first reference value and the second reference value.

In a first embodiment, the above-mentioned first reference value may be calculated as $\Sigma_{k=1}^{L} e^{-PM_k^{(i)}}$, and the above-mentioned second reference value may be calculated as $\Sigma_{k=1}^{L} e^{-PM_{k+L}^{(i)}}$, and the reliability of the i-th bit position may be calculated as $$E_i = \frac{\sum_{k=1}^{L} e^{-PM_k^{(i)}}}{\sum_{k=1}^{L} e^{-PM_{k+L}^{(i)}}}.$$

It can be seen from the reliability formula of the first embodiment that it takes all the paths of the i-th bit position into consideration, which is different from the method in Document 2 where only the last L paths with a larger PM are considered. In addition, it can be seen from the reliability formula of the first embodiment that the bit position including the impact of the frozen bit is also taken into consideration, which is also different from the method of excluding the impact of the frozen bit in Document 2.

In short, the method of calculating the reliability of the first embodiment can achieve a more comprehensive consideration than the method of Document 2, so the first error bit position can be found more accurately.

Generally speaking, the higher the value of $E_i$, the more reliable the i-th bit position. However, the post-processing operation is usually started when decoding errors occur. At this time, the calculated PM is affected by error propagation and tends to be small. And this phenomenon becomes more obvious as the bit position becomes closer to the end.

To improve this problem, the disclosure proposes another reliability estimation method in a second embodiment. Specifically, in the second embodiment, the above-mentioned first reference value may be calculated as $\Sigma_{k=1}^{L} e^{-PM_k^{(i)}}$, and the above-mentioned second reference value may be calculated as $(\Sigma_{k=1}^{L} e^{-PM_{k+L}^{(i)}})^\alpha$ ($\alpha$ is a correction parameter greater than 1), and the reliability of the i-th bit position may be calculated as $$\frac{\sum_{k=1}^{L} e^{-PM_k^{(i)}}}{\left(\sum_{k=1}^{L} e^{-PM_{k+L}^{(i)}}\right)^\alpha}.$$

In addition, in order to make the estimated reliability value easier to interpret, the disclosure further proposes a reliability estimation method in a third embodiment. Specifically, in the third embodiment, the above-mentioned first reference value may be calculated as $\Sigma_{k=1}^{L} e^{-PM_k^{(i)}}$, and the above-mentioned second reference value may be calculated as $(\Sigma_{k=1}^{L} e^{-PM_{k+L}^{(i)}})^\alpha$ ($\alpha$ is a correction parameter greater than 1), and the reliability of the i-th bit position may be calculated as $$E_i'' = \log \frac{\sum_{k=1}^{L} e^{-PM_k^{(i)}}}{\left(\sum_{k=1}^{L} e^{-PM_{k+L}^{(i)}}\right)^\alpha}.$$

In addition, in order to make the foregoing reliability calculations easier to be implemented by the hardware, the disclosure further proposes a reliability estimation method in a fourth embodiment. Specifically, in the fourth embodiment, the above-mentioned first reference value may be calculated as $PM_1^{(i)}$, and the above-mentioned second reference value may be calculated as $PM_{L+1}^{(i)}$, and the reliability of the i-th bit position may be calculated $E_i''' = \alpha' \times PM_{L+1}^{(i)} - PM_1^{(i)}$, where $\alpha'$ is a correction parameter greater than 1.

After determining the reliability of each of the bit positions in the decoding tree according to the above disclosure, in step S430, the processor 304 may select a first specific bit position among the above-mentioned bit positions based on the reliability of each of the bit positions.

In an embodiment, the first specific bit position may have the lowest reliability among the above-mentioned bit positions. That is, the processor 304 may select the bit position with the lowest reliability to perform the subsequent SCL flip operation.

After that, in step S440, the processor 304 may perform the SCL flip operation on the polar code decoding tree based on the first specific bit position. In different embodiments, the processor 304 may apply different flip methods (for example, flip method 1 or flip method 2 in FIG. 2) to perform the SCL flip operation on the first specific bit position in the decoding tree according to the needs of the designer.

For example, assuming that the above-mentioned decoding tree has the state of the polar code decoding tree 211 in FIG. 2 and assuming that the first specific bit position selected by the method of the disclosure is the bit position $u_4$, the processor 304 may correspondingly apply flip method 1 or flip method 2 to flip the bit position $u_4$.

In addition, in an embodiment, if the processor 304 determines that a decoding failure occurs after performing step S440 (that is, none of the surviving paths passes the CRC), the processor 304 may select a second specific bit position as the to-be-flipped bit position based on the reliability of each of the bit positions, and this second specific bit position may have the second lowest reliability among the above-mentioned bit positions. After that, the processor 304 may perform the SCL flip operation on the polar code decoding tree based on the second specific bit position. That is, the processor 304 may select the bit position with the second lowest reliability to perform another SCL flip operation.

In other embodiments, if the processor 304 determines that a decoding failure occurs again after performing step S440, the processor 304 may select the bit position with the third lowest reliability to perform another SCL flip operation, and this process can be continually repeated until the correct decoding path is found or the upper limit of the number of re-decoding times has been reached, but it is not limited thereto.

Experiments have proved that when the upper limit of the number of re-decoding times is not high (for example, 10 times), the disclosure can achieve better decoding performance than the methods in Documents 1 and 2, which means that the strategy of selecting the to-be-flipped bit position in the disclosure can find the bit position where the first error occurs faster.

In summary, the method and the polar code decoder proposed by the disclosure can more accurately find the bit position where the first error occurs, thereby reducing the average decoding times required, accordingly reducing the time required for decoding, and achieving better decoding performance. In addition, in hardware implementations, the method proposed by the disclosure can be easily combined with existing decoders, and the computational complexity can also be reduced through simplified reliability calculation methods.

Although the disclosure has been disclosed in the above embodiments, the embodiments are not intended to limit the disclosure. Persons skilled in the art may make some changes and modifications without departing from the spirit and scope of the disclosure. Therefore, the protection scope of the disclosure shall be determined by the scope of the appended claims.

What is claimed is:

1. A method for determining a to-be-flipped bit position when performing a successive cancellation list (SCL) flip operation, comprising:

obtaining, by a polar code decoder, a polar code segment from a received signal of the polar code decoder or from a codeword to be transmitted, wherein the polar code segment comprises a plurality of bit positions;

obtaining, by the polar code decoder, a polar code decoding tree via performing an SCL operation on the polar code segment, wherein each of the bit positions comprises a plurality of surviving paths and a plurality of pruned paths in the polar code decoding tree;

in a post-processing stage of the SCL operation, for an i-th bit position among the bit positions, estimating, by the polar code decoder, a correct path probability of each of the surviving paths and the pruned paths of the i-th bit position and accordingly estimating a reliability of the i-th bit position;

selecting, by the polar code decoder, a first specific bit position among the bit positions as a to-be-flipped bit position based on the reliability of each of the bit positions; and performing, by the polar code decoder, an SCL flip operation on the polar code decoding tree based on the first specific bit position.

2. The method according to claim 1, wherein the step of estimating the correct path probability of each of the surviving paths and the pruned paths of the i-th bit position comprises:

obtaining a path metric of the surviving paths and the pruned paths of the i-th bit position to accordingly sort the surviving paths and the pruned paths of the i-th bit position into an ascending order to generate a path set corresponding to the i-th bit position, wherein the path set comprises a plurality of paths, wherein the paths sequentially correspond to the surviving paths and the pruned paths; and for a k-th path of the paths in the path set, calculating $e^{-PM_k^{(i)}}$ as the correct path probability of the k-th path, wherein $PM_k^{(i)}$ is the path metric of the k-th path.

3. The method according to claim 2, wherein the reliability of the i-th bit position is calculated as $$E_i = \frac{\sum_{k=1}^{L} e^{-PM_k^{(i)}}}{\sum_{k=1}^{L} e^{-PM_{k+L}^{(i)}}}.$$

4. The method according to claim 2, wherein the reliability of the i-th bit position is calculated as $$E_i' = \frac{\sum_{k=1}^{L} e^{-PM_k^{(i)}}}{\left(\sum_{k=1}^{L} e^{-PM_{k+L}^{(i)}}\right)^\alpha},$$

where $\alpha$ is a correction parameter greater than 1.

5. The method according to claim 2, wherein the reliability of the i-th bit position is calculated as $$E_i'' = \log \frac{\sum_{k=1}^{L} e^{-PM_k^{(i)}}}{\left(\sum_{k=1}^{L} e^{-PM_{k+L}^{(i)}}\right)^\alpha},$$

where $\alpha$ is a correction parameter greater than 1.

6. The method according to claim 2, wherein the reliability of the i-th bit position is calculated as $E_i''' = \alpha' \times PM_{L+1}^{(i)} - PM_1^{(i)}$, where $\alpha'$ is a correction parameter greater than 1.

7. The method according to claim 1, wherein the step of estimating the reliability of the i-th bit position comprises:

estimating a first reference value based on the correct path probability of each of the surviving paths of the i-th bit position;

estimating a second reference value based on the correct path probability of each of the pruned paths of the i-th bit position; and estimating the reliability of the i-th bit position based on the first reference value and the second reference value.

8. The method according to claim 1, wherein the first specific bit position has a lowest reliability among the bit positions.

9. The method according to claim 8, after the step of performing the SCL flip operation on the polar code decoding tree based on the first specific bit position, further comprising:

in response to a determination that a decoding failure occurs, selecting a second specific bit position among the bit positions as the to-be-flipped bit position based on the reliability of each of the bit positions, wherein the second specific bit position has a second lowest reliability among the bit positions; and performing the SCL flip operation on the polar code decoding tree based on the second specific bit position.

10. A polar code decoder, comprising:
    a storage circuit, storing a plurality of modules; and
    a processor, coupled to the storage circuit and accessing the modules to perform:

obtaining a polar code segment from a received signal of the polar code decoder or from a codeword to be transmitted, wherein the polar code segment comprises a plurality of bit positions;

obtaining a polar code decoding tree via performing an SCL operation on the polar code segment, wherein each of the bit positions comprises a plurality of surviving paths and a plurality of pruned paths in the polar code decoding tree;

in a post-processing stage of the SCL operation, for an i-th bit position among the bit positions, estimating a correct path probability of each of the surviving paths and the pruned paths of the i-th bit position and accordingly estimating a reliability of the i-th bit position;

selecting a first specific bit position among the bit positions as a to-be-flipped bit position based on the reliability of each of the bit positions; and performing an SCL flip operation on the polar code decoding tree based on the first specific bit position.

* * * * *